(12) United States Patent
Pavlovski et al.

(10) Patent No.: US 10,454,273 B2
(45) Date of Patent: Oct. 22, 2019

(54) FORECASTING NET LOAD IN A DISTRIBUTED UTILITY GRID

(71) Applicant: GREEN POWER LABS INC., Dartmouth (CA)

(72) Inventors: Alexandre Pavlovski, Bedford (CA); Dmitriy Anichkov, Somerville, NJ (US)

(73) Assignee: GREEN POWER LABS INC., Dartmouth, NS (CA)

(*) Notice: Subject to any disclaimer, the term of this patent is extended or adjusted under 35 U.S.C. 154(b) by 190 days.

(21) Appl. No.: 15/520,561

(22) PCT Filed: Oct. 20, 2015

(86) PCT No.: PCT/US2015/056427
§ 371 (c)(1),
(2) Date: Apr. 20, 2017

(87) PCT Pub. No.: WO2016/069330
PCT Pub. Date: May 6, 2016

(65) Prior Publication Data
US 2017/0317495 A1    Nov. 2, 2017

Related U.S. Application Data

(60) Provisional application No. 62/068,750, filed on Oct. 26, 2014.

(51) Int. Cl.
*H02J 3/06*    (2006.01)
*G01R 22/00*    (2006.01)
(Continued)

(52) U.S. Cl.
CPC .............. *H02J 3/06* (2013.01); *G01R 22/00* (2013.01); *G06Q 10/04* (2013.01); *G06Q 50/06* (2013.01);
(Continued)

(58) Field of Classification Search
CPC .......... H02J 3/06; H02J 3/12; H02J 2003/003; G01R 22/00; G06Q 10/04; G06Q 50/06; Y04S 10/54
See application file for complete search history.

(56) References Cited

U.S. PATENT DOCUMENTS 6,975,925 B1    12/2005    Barnes et al.
7,991,567 B1 *    8/2011    Mulick ..................... H02J 9/06
361/600

(Continued)

OTHER PUBLICATIONS

Stefopoulos et al., "Probabilistic Power Flow with Non-Conforming Electric Loads", 8th International Conference on Probabilistic Methods Applied to Power Systems, Iowa State University, Ames, Iowa, Sep. 12-16, 2004 (Year: 2004).*

(Continued)

*Primary Examiner* — Thomas C Lee
*Assistant Examiner* — Michael Tang

(57) ABSTRACT

A method for generating a net load forecast for a utility grid, the grid including intermittent distributed energy resources and loads, comprising: defining two or more load forecast zones, each zone being associated with a load profile type and a climate zone type; assigning each of the loads to one of the zones based on the load profile and climate zone types associated with the load; assigning each of the energy resources to at least one of the zones based on the climate zone type associated with the energy resource; for each zone, generating an electrical energy consumption forecast for loads, an electric power generation forecast for energy resources, and a net load forecast from the electrical energy consumption and electric power generation forecasts; combining the net load forecast for each zone to generate the net load forecast for the grid; and, presenting the net load forecast on a display.

22 Claims, 12 Drawing Sheets

(51) Int. Cl.
*G06Q 10/04* (2012.01)
*G06Q 50/06* (2012.01)
*H02J 3/12* (2006.01)
*H02J 3/00* (2006.01)

(52) U.S. Cl.
CPC ........... *H02J 3/12* (2013.01); *H02J 2003/003* (2013.01); *Y04S 10/54* (2013.01)

(56) References Cited

U.S. PATENT DOCUMENTS

| | | | | |
|---|---|---|---|---|
| 8,996,181 | B2* | 3/2015 | Razum | G06Q 10/06 700/286 |
| 9,778,673 | B2* | 10/2017 | Schwarz | G05F 1/66 |
| 2008/0195255 | A1 | 8/2008 | Lutze et al. | |
| 2010/0094573 | A1 | 4/2010 | Yang et al. | |
| 2010/0229016 | A1* | 9/2010 | Kodama | H04L 43/08 713/340 |
| 2012/0059607 | A1* | 3/2012 | Rebec | G06K 9/0055 702/61 |
| 2012/0065788 | A1* | 3/2012 | Harper, III | G06F 1/3206 700/291 |
| 2012/0123995 | A1 | 5/2012 | Boot | |
| 2012/0271474 | A1* | 10/2012 | Yoneda | H02J 13/0079 700/295 |
| 2012/0303300 | A1 | 11/2012 | McDonald et al. | |
| 2012/0330472 | A1* | 12/2012 | Boot | G06Q 50/06 700/291 |
| 2013/0166085 | A1* | 6/2013 | Cherian | G05B 13/02 700/291 |
| 2014/0005849 | A1 | 1/2014 | Sun et al. | |
| 2014/0021787 | A1* | 1/2014 | Wen | H02J 3/14 307/39 |
| 2014/0074305 | A1* | 3/2014 | Dzafic | H02J 13/0013 700/291 |
| 2015/0168177 | A1* | 6/2015 | Shah | G06Q 50/06 340/870.02 |

OTHER PUBLICATIONS

Wu et al., "Review of Ecological Engineering Solutions for Rural Non-Point SourceWater Pollution Control in Hubei Province, China" ,Water Air Soil Pollut (2013) 224:1561 (Year: 2013).*
International Search Report, PCT/US15/56427, dated Feb. 4, 2016, 3 pages.

* cited by examiner

|  |  | Climate Zones: | | |
| --- | --- | --- | --- | --- |
|  |  | Climate Zone 1 | Climate Zone 2 | Climate Zone 3 |
| Electricity Consumption Patterns: | Conforming Loads | Load Forecasting Zone 1C includes: Load 1, Load 4, ... Load N | Load Forecasting Zone 2C includes: Load M ... Load M+L | Load Forecasting Zone 3C includes: Load X ... Load X+Y |
|  | Non-conforming Loads | Load Forecasting Zone 1NC includes: Load 2, Load 3, Load K | Load Forecasting Zone 2NC includes: Load M+L+1 ... Load +L+O | Load Forecasting Zone 3NC includes: Load Z |

FIG. 1A

FORECASTING NET LOAD IN A DISTRIBUTED UTILITY GRID

This application claims priority from and the benefit of the filing date of U.S. Provisional Patent Application No. 62/068,750, filed Oct. 26, 2014, and the entire content of such application is incorporated herein by reference.

FIELD OF THE APPLICATION

This application relates to the field of net load forecasting, and more specifically, to a utility grid, a net load forecasting system, and a method for forecasting net load in a utility grid having distributed energy resources.

BACKGROUND OF THE APPLICATION

Load forecasting in a utility grid is an integral part of energy management. Growing penetration of distributed energy resources such as solar photovoltaic ("PV") power plants, wind power plants, and power storage plants has changed conventional utility practices for generating, transmitting, and distributing electric power.

A group of power plants, electrical energy consumption devices, and associated infrastructure spread over a geographical area may be referred to as a utility grid. Variations in power generation by distributed energy resources due to their intermittent nature and related changes in energy consumption can cause variations in operating conditions in a utility grid, such as voltage and frequency, beyond their standard or desired ranges.

Typically, operating conditions in a utility grid are managed by an energy management system ("EMS"). The utility grid's energy management system maintains the balance between all available energy resources including centralized energy resources such as coal, natural gas, oil or hydro and distributed energy resources such as solar, wind or storage, and energy uses such as uncontrolled and controlled electrical energy consumption devices. Load forecasting is used by the energy management system to reduce the imbalance between the available energy resources and intended uses thereby maintaining operating conditions in the utility grid within their standard or desired ranges.

Typically, an electrical energy consumption device or load in a utility grid is characterized by a load curve or profile. A load profile is a plot of electrical energy consumption variation as a function of time for a load or group of loads. Daily, weekly, monthly, and yearly load profiles are commonly developed and used in order to gain insight into the usage behavior of a group of loads. Loads in a utility grid may be classified as one of two major types, namely, conforming loads and non-conforming loads. A conforming load, relative to a group of loads, has a load profile that looks similar to the group's load profile. A non-conforming curve does not.

Due to their conventional behavioral patterns, electrical energy consumption for conforming loads may be forecast with a high level of accuracy using statistical forecasting methods. In contrast, electrical energy consumption for nonconforming loads is typically forecast with lower accuracy. If the load profile of nonconforming loads are unknown, their presence in a utility grid presents a significant challenge for the energy management system.

Growing penetration of distributed energy resources may change the balance between centralized energy resources and energy consumption in utility grids. To maintain this balance, the grid may be characterized by an equivalent load referred to as a "net load". For a portion of a utility grid, the net load represents the difference between the power demand of a group of loads and the power generated by distributed energy resources located within that portion of the utility grid.

As distributed energy resources are typically intermittent by their nature, their presence in a portion of the utility grid makes the net load in that portion of the grid non-conforming. This creates a significant load forecasting and energy management problem and reduces the energy management system's ability to maintain the grid's stability.

A need therefore exists for an improved utility grid, net load forecasting system, and method for forecasting net load in a utility grid having distributed energy resources. Accordingly, a solution that addresses, at least in part, the above and other shortcomings is desired.

SUMMARY OF THE APPLICATION

According to one aspect of the application, there is provided a method for generating a net load forecast for a utility grid, the utility grid including one or more intermittent distributed energy resources and one or more loads, the method comprising: using a processor, defining two or more load forecast zones, each load forecast zone being associated with a load profile type and a climate zone type; assigning each of the one or more loads to one of the two or more load forecast zones based on the load profile type and the climate zone type associated with the load; assigning each of the one or more intermittent distributed energy resources to at least one of the two or more load forecast zones based on the climate zone type associated with the intermittent distributed energy resource; for each load forecast zone, generating an electrical energy consumption forecast for loads assigned thereto, an electric power generation forecast for intermittent distributed energy resources assigned thereto, and a net load forecast from the electrical energy consumption forecast and the electric power generation forecast; combining the net load forecast for each load forecast zone to generate the net load forecast for the utility grid; and, presenting the net load forecast for the utility grid on a display.

In accordance with further aspects of the application, there is provided an apparatus such as a data processing system, a net load forecasting system, a control system, etc., a method for adapting same, as well as articles of manufacture such as a computer readable medium or product and computer program product or software product (e.g., comprising a non-transitory medium) having program instructions recorded thereon for practising the method of the application.

BRIEF DESCRIPTION OF THE DRAWINGS

Further features and advantages of the embodiments of the present application will become apparent from the following detailed description, taken in combination with the appended drawings, in which:

FIG. 1A is a table illustrating a division of loads in a utility grid into load forecast zones in accordance with an embodiment of the application;

It will be noted that throughout the appended drawings, like features are identified by like reference numerals.

DETAILED DESCRIPTION OF THE EXAMPLE EMBODIMENTS

Figure 1:
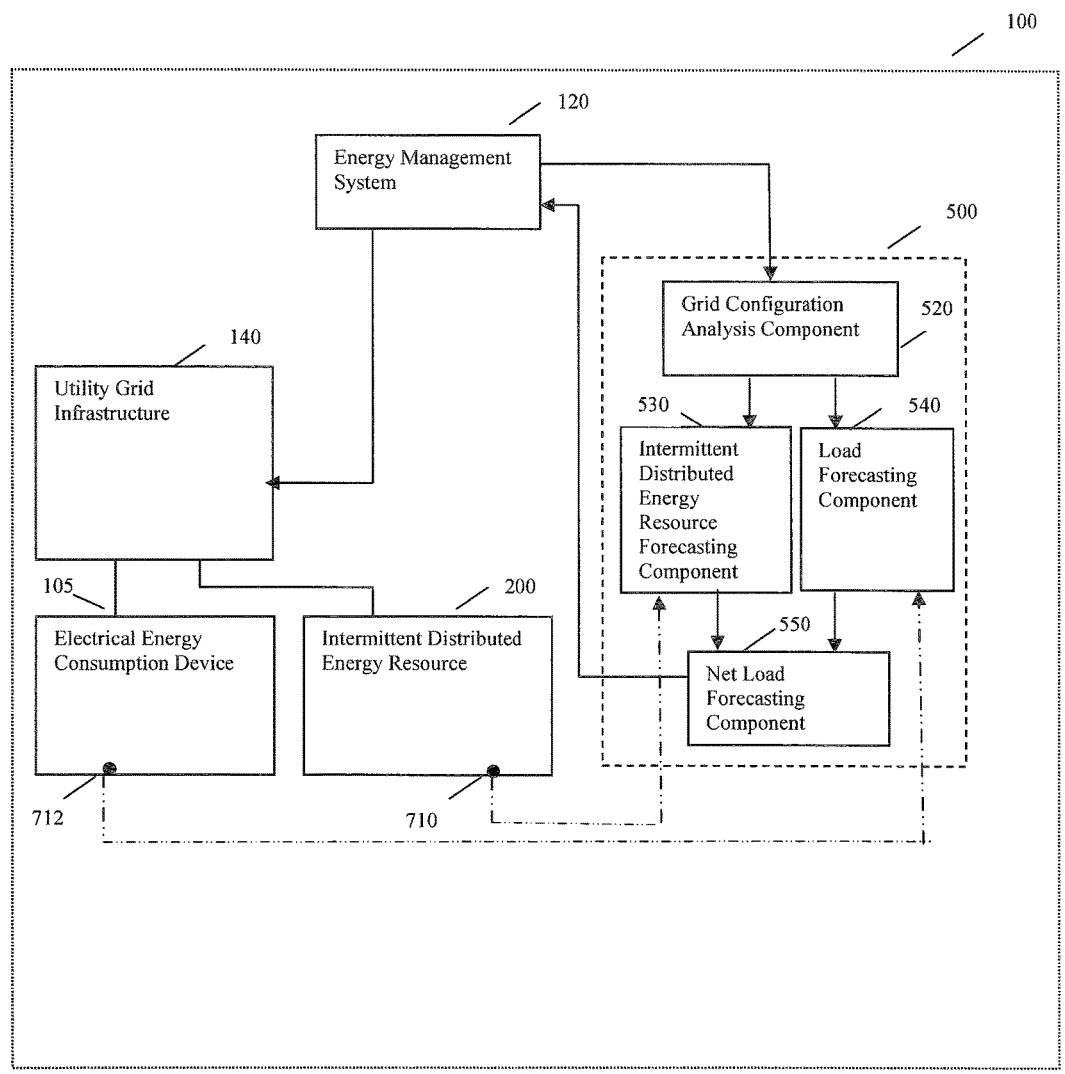
FIG. 1 is a block diagram illustrating a utility grid and a net load forecasting system in accordance with an embodiment of the application.

In the following description, details are set forth to provide an understanding of the application. In some instances, certain software, circuits, structures and methods have not been described or shown in detail in order not to obscure the application. The term "data processing system" or "system" is used herein to refer to any machine for processing data, including the net load forecasting systems, control systems, controllers, energy management systems, computer systems, and network arrangements described herein. The present application may be implemented in any computer programming language provided that the operating system of the data processing system provides the facilities that may support the requirements of the present application. Any limitations presented would be a result of a particular type of operating system or computer programming language and would not be a limitation of the present application. The present application may also be implemented in hardware or in a combination of hardware and software.

According to one embodiment of the application, there is provided a utility grid. The utility grid includes at least one electrical energy consumption device; at least one intermittent distributed energy resource; a net load forecasting system for forecasting power generation by the distributed energy resource and energy consumption by the electrical energy consumption device, and an energy management system, wherein the energy management system is connected or coupled to the net load forecasting system and is configured to acquire forecasts from the net load forecasting system to maintain desired operating conditions in the utility grid.

According to another embodiment, there is provided a net load forecasting system for improving the performance of the energy management system. The net load forecasting system is configured to analyse one or more utility grid specifications including but not limited to the configuration of electrical circuits in the utility grid or advanced metering infrastructure, the applicable geographic areas, time zones and micro-climatological areas, and the location and characteristics of distributed energy resources, and to provide a net load forecast for the utility grid or any portion thereof at least partially based on at least one forecasting variable selected from the group consisting of: a weather forecast, a storm warning, wind speed, air density, irradiance, atmospheric turbulence, rain condition, snow condition, air temperature, humidity, energy storage capacity, and power demand.

According to another embodiment, there is provided a method for forecasting net load in a utility grid with distributed energy resources. The method includes dividing net load in the utility grid, and/or any portion thereof, into power demand by electrical energy consumption devices and power supplied by distributed energy resources; forecasting power supply from distributed energy resources individually per customer meter or in groups per distribution transformer, feeder, substation transformer, substation, or combinations thereof using analytical models, statistical methods, and artificial intelligence methods, or combinations thereof; forecasting power demand by electrical energy consumption devices individually per customer meter or in groups per distribution transformer, feeder, substation transformer, substation, or combinations thereof, using statistical methods, artificial intelligence methods, and the like, or combinations thereof; generating power demand and power supply forecasts for the utility grid, or any portion thereof, to achieve higher net load forecast accuracy, lower uncertainty of net load forecasts, and lower operating costs of addressing uncertainty and accuracy.

Figure 9:
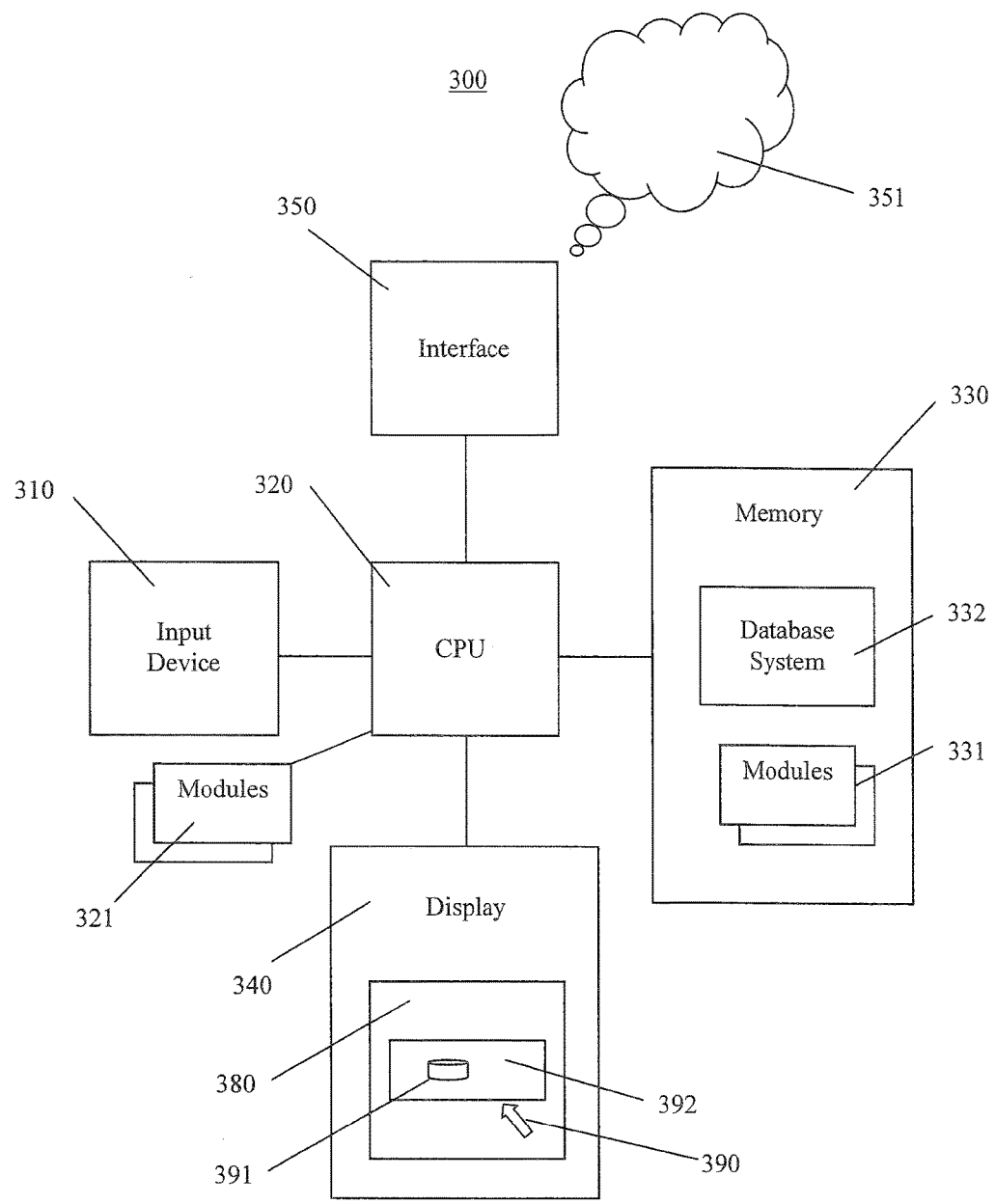
FIG. 9 is a block diagram illustrating a data processing system in accordance with an embodiment of the application; and, FIG. 10 is a flow chart illustrating operations of modules within a data processing system for generating a net load forecast for a utility grid, the utility grid including one or more intermittent distributed energy resources and one or more loads, in accordance with an embodiment of the application.

FIG. 9 is a block diagram illustrating a data processing system 300 in accordance with an embodiment of the application. The data processing system 300 is suitable for performing as a net load forecasting system 500, a control system, programmable logic controller ("PLC"), a supervisory control and data acquisition ("SCADA"), an energy management system ("EMS") 120, or the like. The data processing system 300 is also suitable for data processing, management, storage, and for generating, displaying, and adjusting presentations in conjunction with a user interface or a graphical user interface ("GUI"), as described below. The data processing system 300 may be a client and/or server in a client/server system. For example, the data processing system 300 may be a server system or a personal computer ("PC") system. The data processing system 300 may also be a distributed system which is deployed across multiple processors. The data processing system 300 may also be a virtual machine. The data processing system 300 includes an input device 310, at least one central processing unit ("CPU") 320, memory 330, a display 340, and an interface device 350. The input device 310 may include a keyboard, a mouse, a trackball, a touch sensitive surface or screen, a position tracking device, an eye tracking device, a camera, a tactile glove or gloves, a gesture control armband, or a similar device. The display 340 may include a computer screen, a television screen, a display screen, a terminal device, a touch sensitive display surface or screen, a hard-copy producing output device such as a printer or plotter, a head-mounted display, virtual reality ("VR") glasses, an augmented reality ("AR") display, a hologram display, or a similar device. The memory 330 may include a variety of storage devices including internal memory and external mass storage typically arranged in a hierarchy of storage as understood by those skilled in the art. For example, the memory 330 may include databases, random access memory ("RAM"), read-only memory ("ROM"), flash memory, and/or disk devices. The interface device 350 may include one or more network connections. The data processing system 300 may be adapted for communicating with other data processing systems (e.g., similar to the data processing system 300) over a network 351 via the interface device 350. For example, the interface device 350 may include an interface to a network 351 such as the Internet and/or another wired or wireless network (e.g., a wireless local area network ("WLAN"), a cellular telephone network, etc.). As such, the interface 350 may include suitable transmitters, receivers, antennae, etc. Thus, the data processing system 300 may be linked to other data processing systems by the network 351. In addition, the interface device 350 may include one or more input and output connections or points for connecting various sensors (e.g., 710, 712, 740), status (indication) inputs, analog (measured value) inputs, counter inputs, analog outputs, and control outputs to the data processing system 300. The CPU 320 may include or be operatively coupled to dedicated coprocessors, memory devices, or other hardware modules 321. The CPU 320 is operatively coupled to the memory 330 which stores an operating system (e.g., 331) for general management of the system 300. The CPU 320 is operatively coupled to the input device 310 for receiving user commands, queries, or data and to the display 340 for displaying the results of these commands, queries, or data to the user. Commands, queries, and data may also be received via the interface device 350 and results and data may be transmitted via the interface device 350. The data processing system 300 may include a data store or database system 332 for storing data and programming information. The database system 332 may include a database management system (e.g., 332) and a database (e.g., 332) and may be stored in the memory 330 of the data processing system 300. In general, the data processing system 300 has stored therein data representing sequences of instructions which when executed cause the method described herein to be performed. Of course, the data processing system 300 may contain additional software and hardware a description of which is not necessary for understanding the application.

Thus, the data processing system 300 includes computer executable programmed instructions for directing the system 300 to implement the embodiments of the present application. The programmed instructions may be embodied in one or more hardware modules 321 or software modules 331 resident in the memory 330 of the data processing system 300 or elsewhere (e.g., 320). Alternatively, the programmed instructions may be embodied on a computer readable medium or product (e.g., one or more digital video disks ("DVDs"), compact disks ("CDs"), memory sticks, etc.) which may be used for transporting the programmed instructions to the memory 330 of the data processing system 300. Alternatively, the programmed instructions may be embedded in a computer-readable signal or signal-bearing medium or product that is uploaded to a network 351 by a vendor or supplier of the programmed instructions, and this signal or signal-bearing medium or product may be downloaded through an interface (e.g., 350) to the data processing system 300 from the network 351 by end users or potential buyers.

A user may interact with the data processing system 300 and its hardware and software modules 321, 331 using a user interface such as a graphical user interface ("GUI") 380 (and related modules 321, 331). The GUI 380 may be used for monitoring, managing, and accessing the data processing system 300. GUIs are supported by common operating systems and provide a display format which enables a user to choose commands, execute application programs, manage computer files, and perform other functions by selecting pictorial representations known as icons, or items from a menu through use of an input device 310 such as a mouse. In general, a GUI is used to convey information to and receive commands from users and generally includes a variety of GUI objects or controls, including icons, toolbars, drop-down menus, text, dialog boxes, buttons, and the like. A user typically interacts with a GUI 380 presented on a display 340 by using an input device (e.g., a mouse) 310 to position a pointer or cursor 390 over an object (e.g., an icon) 391 and by selecting or "clicking" on the object 391. Typically, a GUI based system presents application, system status, and other information to the user in one or more "windows" appearing on the display 340. A window 392 is a more or less rectangular area within the display 340 in which a user may view an application or a document. Such a window 392 may be open, closed, displayed full screen, reduced to an icon, increased or reduced in size, or moved to different areas of the display 340. Multiple windows may be displayed simultaneously, such as: windows included within other windows, windows overlapping other windows, or windows tiled within the display area.

FIG. 1 is a block diagram illustrating a utility grid and a net load forecasting system in accordance with an embodiment of the application. And, FIG. 1A is a table illustrating a division of loads 105 in a utility grid 100 into load forecast zones 900 in accordance with an embodiment of the application. The utility grid 100 includes an energy management system 120 which manages electric power generation and electrical energy consumption within the grid 100. In FIG. 1, only a portion of the grid 100 is shown in detail while the remaining portions of the utility grid infrastructure are represented by reference numeral 140. It will be understood by those skilled in the art that the utility grid infrastructure 140 may include a plurality of power lines, electric power generation systems, electrical energy consumption devices, and the like. However, a detailed representation of the utility grid infrastructure 140 is not essential for understanding the principles underlying the present application and has, therefore, been omitted.

The utility grid 100 includes at least one load or electrical energy consumption device 105. The at least one electrical energy consumption device 105 may be one or a cluster of residential and/or commercial buildings, a municipal or industrial electrical load of any kind, or the like. Furthermore, it will be understood by those skilled in the art that one or a plurality of electrical energy consumption devices 105 may be provided without limiting the scope of the application.

The utility grid 100 also includes an intermittent distributed energy resource 200. In the embodiment of FIG. 1, the intermittent distributed energy resource 200 is not limited to a specific intermittent source of energy, like solar or wind power, which it uses to generate electric power. Rather, it will be understood by those skilled in the art that the intermittent distributed energy resource 200 may include a single solar power plant or wind power plant or multiple solar and/or wind power plants of any size connected to the grid 100, or any other power plant(s) using intermittent energy sources like in-stream hydro, wave or tidal power, or any other hybrid power plant using intermittent energy sources. In the following, the energy source of the intermittent distributed energy resource 200 will not be specified so as not to limit the scope of the present application thereto. It will be understood by those skilled in the art that any power plants using energy sources exhibiting intermittent electric power generation behavior, i.e., a fluctuating behavior, may be used as the intermittent distributed energy resource without deviating from the scope of the present application.

The utility grid 100 further includes a net load forecasting system 500. The net load forecasting system 500 forecasts distributed power generation and energy consumption in the utility grid 100. In more detail, and still referring to FIG. 1, the net load forecasting system 500 includes a grid configuration analysis component 520, an intermittent distributed energy resource forecasting component 530, a load forecasting component 540, and a net load forecasting component 550.

The grid configuration analysis component 520 is connected (or communicatively coupled) to the energy management system 120. The energy management system 120 is configured to inform or update the net load forecasting system 500 with respect to the current configuration and status of electric circuits in the utility grid 100. As a part of the net load forecasting system 500, the grid configuration analysis component 520 is configured to receive, maintain, and periodically update data with respect to distributed energy resources and loads in the grid 100 from the energy management system 120.

The grid configuration analysis component 520 is connected to the intermittent distributed energy resource forecasting component 530 and to the load forecasting component 540. The grid configuration analysis component 520 is configured to branch or divide the utility grid 100 into load forecast zones 900 according to climate conditions (or climate zone types) 910 and/or electrical energy consumption patterns (or load profile types) 920 to maximize the accuracy of distributed energy resource and load forecasting. FIG. 1A shows how loads 105 may be divided into load forecast zones 900 according to one embodiment. The division may be made based on features of individual loads (e.g., geographical location, electricity consumption pattern 920, etc.) and mathematical optimization methods directed to maximizing forecasting accuracy.

The intermittent distributed energy resource forecasting component 530 and the load forecasting component 540 are connected to the net load forecasting component 550. The intermittent distributed energy resource forecasting component 530 and the load forecasting component 540 are respectively configured to forecast distributed power generation and electrical energy consumption in the utility grid 100 or any portion thereof.

The net load forecasting component 550 is connected to the energy management system 120. The net load forecasting component 550 is configured to produce net load forecasts for the utility grid 100, or any portion thereof, based on the data generated by the intermittent distributed energy resource forecasting component 530 and the load forecasting component 540. The energy management system 120 is configured to request net load forecasts for the utility grid 100, or any portion thereof, to maintain operating conditions in the grid 100 within a desired range.

The grid configuration analysis component 520 is configured to accept real-time requests from the energy management system 120 defining the number and configuration of load forecast zones 900 in the utility grid 100 for net load forecasting. The grid configuration analysis component 520 makes subsequent real-time requests to the intermittent distributed energy resource forecasting component 530 and the load forecasting component 540 to produce their respective forecasts for distributed energy resources 200 and loads 105 in the load forecast zones 900 defined by the energy management system 120.

The intermittent distributed energy resource forecasting component 530 forecasts electric power generation by intermittent distributed energy resources 200 within the load forecast zones 900 individually, or in clusters, using analytical models based on physical principles, statistical methods, and artificial intelligence methods, or combinations thereof.

The load forecasting component 540 forecasts electrical energy consumption within the load forecast zones 900 individually per customer meter, or in clusters per distribution transformer, feeder, substation, or their combinations using statistical methods, artificial intelligence methods, or the like, or combinations thereof. To increase the accuracy of forecasting, the loads 105 in the load forecast zones 900 may be grouped or aggregated using non-conforming criteria and forecasts may be provided for each load forecast zone 900. Load aggregation may be performed by mathematical optimization methods aimed at maximizing forecast accuracy. Examples of load groups may include the following: conforming residential and commercial loads, non-conforming commercial loads, and non-conforming industrial loads.

The net load forecasting component 550 is configured to accept real-time data from the intermittent distributed energy resource forecasting component 530 and the load forecasting component 540 to produce net load forecasts for the load forecast zones 900 defined by the energy management system 120.

Advantageously, by dividing the net load in the load forecast zones 900 into loads and intermittent distributed energy resources, grouping the loads by their level of conformance, providing independent forecasts for the distributed energy resources and for the load groups, and combining these forecasts into a single net load forecast for the load forecast zones 900, the overall level of non-conformance of the load forecast zones 900 is reduced and higher accuracy of net load forecasts may be achieved.

Typically, the accuracy of forecasting produced by the net load forecasting system 500 depends on the availability of near real-time observed data for electrical energy consumption by the electrical energy consumption devices 105 and electric power generation by the intermittent distributed energy resources 200. Therefore, the net load forecasting system 500 is typically connected to at least one sensor for measuring at least one grid variable, so that control may be at least partially based on the at least one grid variable measured by the sensor. In the embodiment of FIG. 1, the distributed energy resource forecasting component 530 is connected to a first sensor 710 for sensing electric power generation (or output) of the intermittent distributed energy resource 200 and to a second sensor 712 for measuring electrical energy consumption (or electric power demand) of the electrical energy consumption device 105. However, it will be understood by those skilled in the art that, that the sensors 710 and 712 may measure one or more of any of the aforementioned grid variables. Furthermore, the net load forecasting system 500 may be provided with additional grid sensors for measuring additional grid variables.

Figure 2:
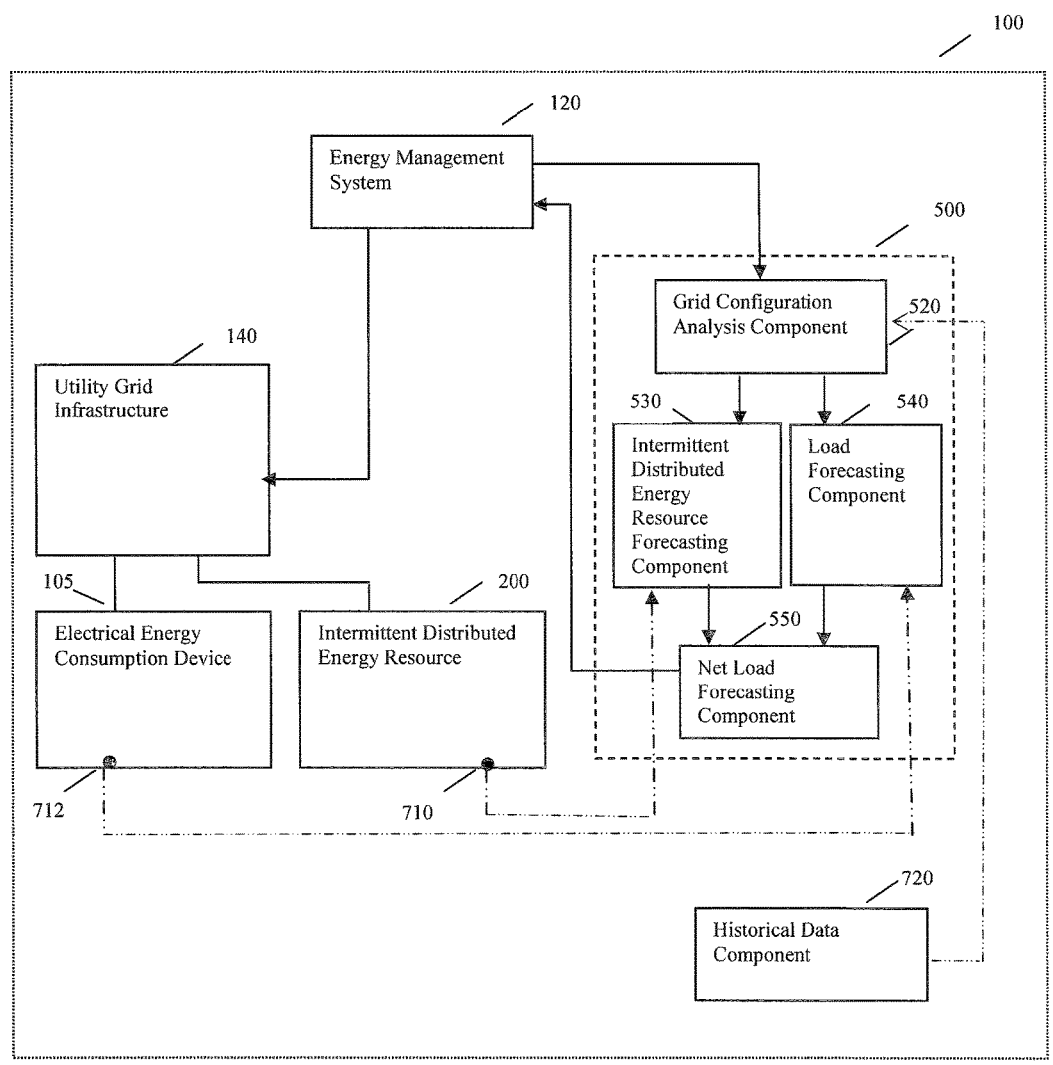
FIG. 2 is a block diagram illustrating a utility grid and a net load forecasting system in accordance with another embodiment of the application.

FIG. 2 is a block diagram illustrating a utility grid 100 and a net load forecasting system 500 in accordance with another embodiment of the application. The basic configuration of the utility grid 100 in FIG. 2 is similar to the grid 100 shown in FIG. 1. However, in FIG. 2, the grid configuration analysis component 520 is connected (or communicatively coupled) to a historical data component 720 for providing data on historical climate conditions and electrical energy consumption patterns in the utility grid area (or territory). The grid configuration analysis component 520 uses the historical climate data to aggregate the loads 105 in the utility grid area into climate-related groups to better represent microclimatology in the utility grid area so as to improve the accuracy of intermittent distributed energy resource forecasting. In addition, the grid configuration analysis component 520 uses the historical electrical energy consumption data to aggregate all the loads 105 in the utility grid area into load conformance-related groups to better represent load conformance in the utility grid area and improve the accuracy of load forecasting. The climate-related groups and load conformance-related groups are then used to represent the utility grid area by a network of load forecast zones 900 to maximize the accuracy of distributed energy resources, load forecasts, and net load forecasts in each of these load forecast zones 900.

The grid configuration analysis component 520 provides data with respect to the load forecast zones 900 to the intermittent distributed energy resource forecasting component 530 and to the load forecasting components 540 to produce their respective forecasts for each load forecast zone 900 and to provide these forecasts to the net load forecasting component 550. The net load forecasting component 550 then generates net load forecasts for the load forecast zones 900 defined by the energy management system 120.

Figure 3:
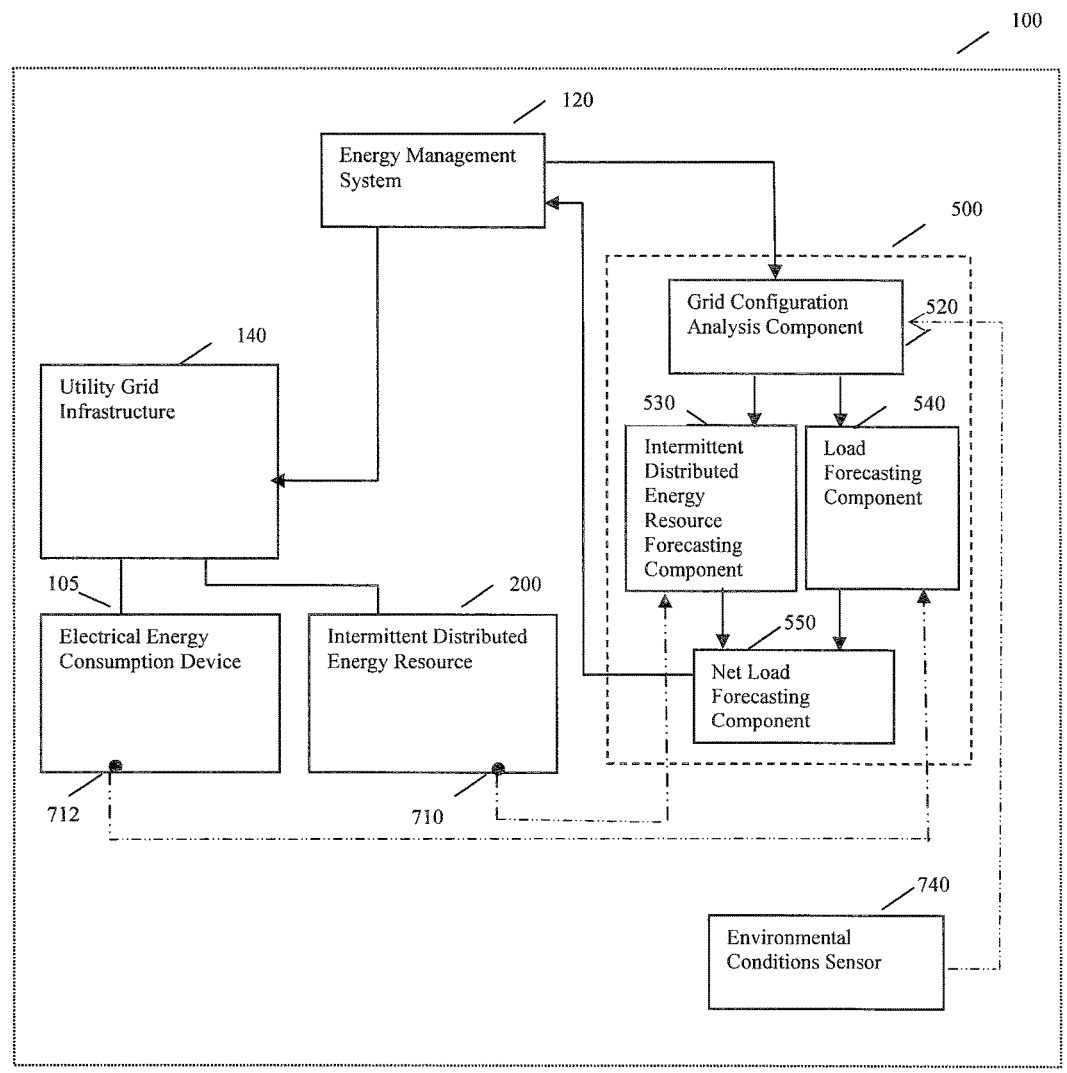
FIG. 3 is a block diagram illustrating a utility grid and a net load forecasting system in accordance with another embodiment of the application.

FIG. 3 is a block diagram illustrating a utility grid 100 and a net load forecasting system 500 in accordance with another embodiment of the application. The basic configuration of the utility grid 100 in FIG. 3 is similar to the grid 100 shown in FIG. 1. However, in FIG. 3, the grid configuration analysis component 520 is connected to at least one sensor 740 having an output indicative of at least one environmental condition. The net load forecasting system 500 is configured to produce net load forecasts at least partially based on the at least one environmental condition measured by the sensor 740. Typical environmental conditions monitored or measured by the environmental condition sensor 740 include wind speed, air density, irradiance, atmospheric turbulence, rain conditions, snow conditions, air temperature, and humidity. Accordingly, the sensor 740 may include an anemometer, an air densimeter, a hygrometer, a thermometer, a rain sensor, a snow sensor, a turbulence sensor, and the like. Since the power output of the intermittent distributed energy resources 200 strongly depends on environmental conditions, in particular on atmospheric conditions, the accuracy of forecasting by the intermittent distributed energy resource forecasting component 530 may be improved by taking into account the environmental conditions determining the power output of the intermittent distributed energy resources 200.

Figure 4:
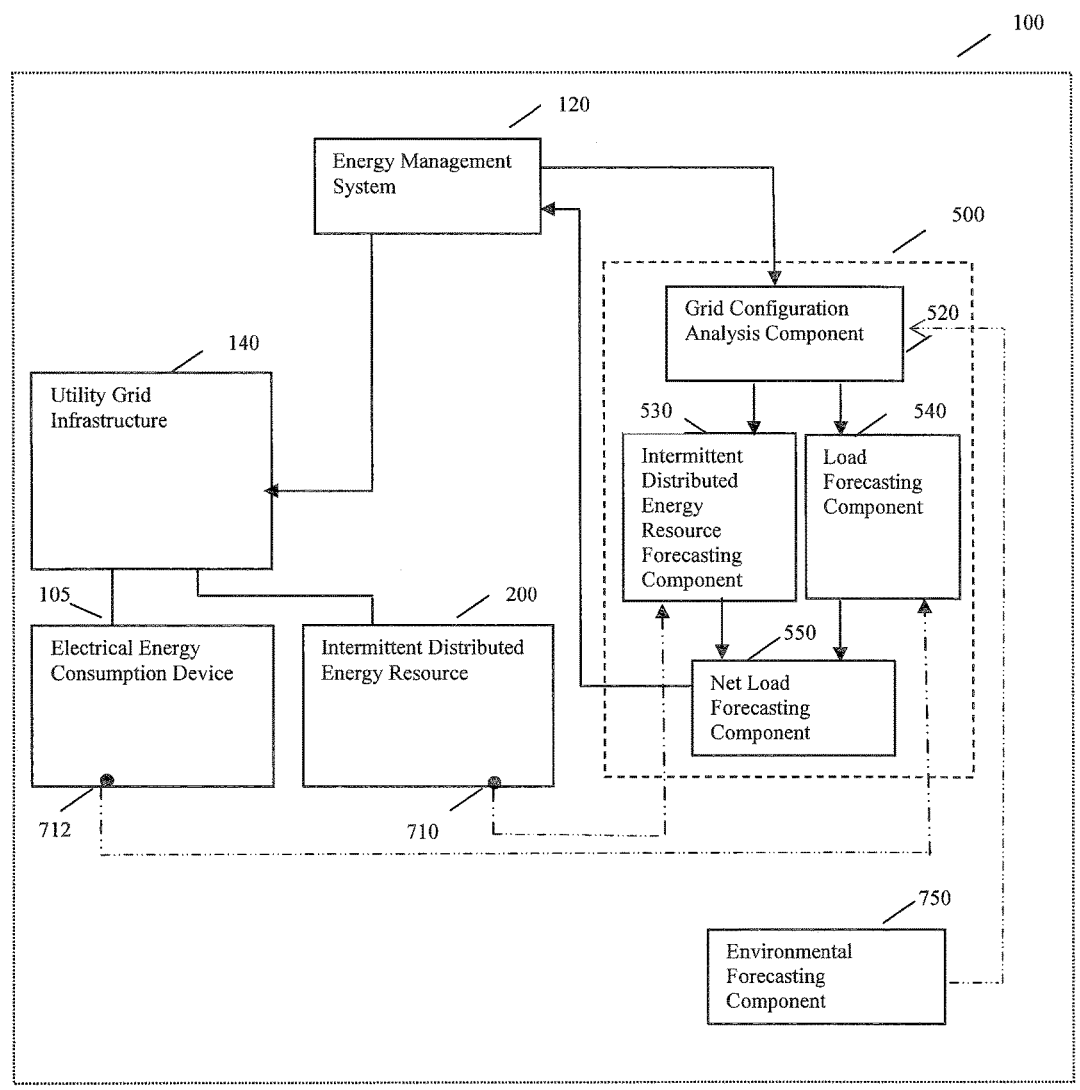
FIG. 4 is a block diagram illustrating a utility grid and a net load forecasting system in accordance with another embodiment of the application.

FIG. 4 is a block diagram illustrating a utility grid 100 and a net load forecasting system 500 in accordance with another embodiment of the application. The basic configuration of the utility grid 100 in FIG. 4 is similar to the grid 100 shown in FIG. 1. However, in FIG. 4, the grid configuration analysis component 520 is connected to at least one environmental forecasting component 750 providing at least one forecasting variable. The net load forecasting system 500 is configured to forecast net load at least partially based on the at least one forecasting variable provided by the environment forecasting component 750. Typical environmental forecasting variables predicted by the environmental forecasting component 750 include weather forecasts, storm warnings, wind speed, air density, air turbidity, irradiance, atmospheric turbulence, rain conditions, snow conditions, air temperature, and humidity. Accordingly, the environmental forecasting component 750 may include a meteorological service. Thus, the intermittent distributed energy resource forecasting component 530 may anticipate the future weather conditions at the site of an intermittent distributed energy resource 200 within a selected forecast horizon. In particular, the intermittent distributed energy resource forecasting component 530 may determine a plurality of meteorological scenarios weighted with different probabilities. That is, an ensemble forecast may be generated using several forecast sources by attaching a weighting factor or weight to each source based on its behavior at the target location. Since the power output of an intermittent distributed energy resource 200 strongly depends on the weather conditions at its location or site, the accuracy of forecasting by the intermittent distributed energy resource forecasting component 530 may be improved by taking into account future weather conditions governing the future power output of the intermittent distributed energy resources 200.

Figure 5:
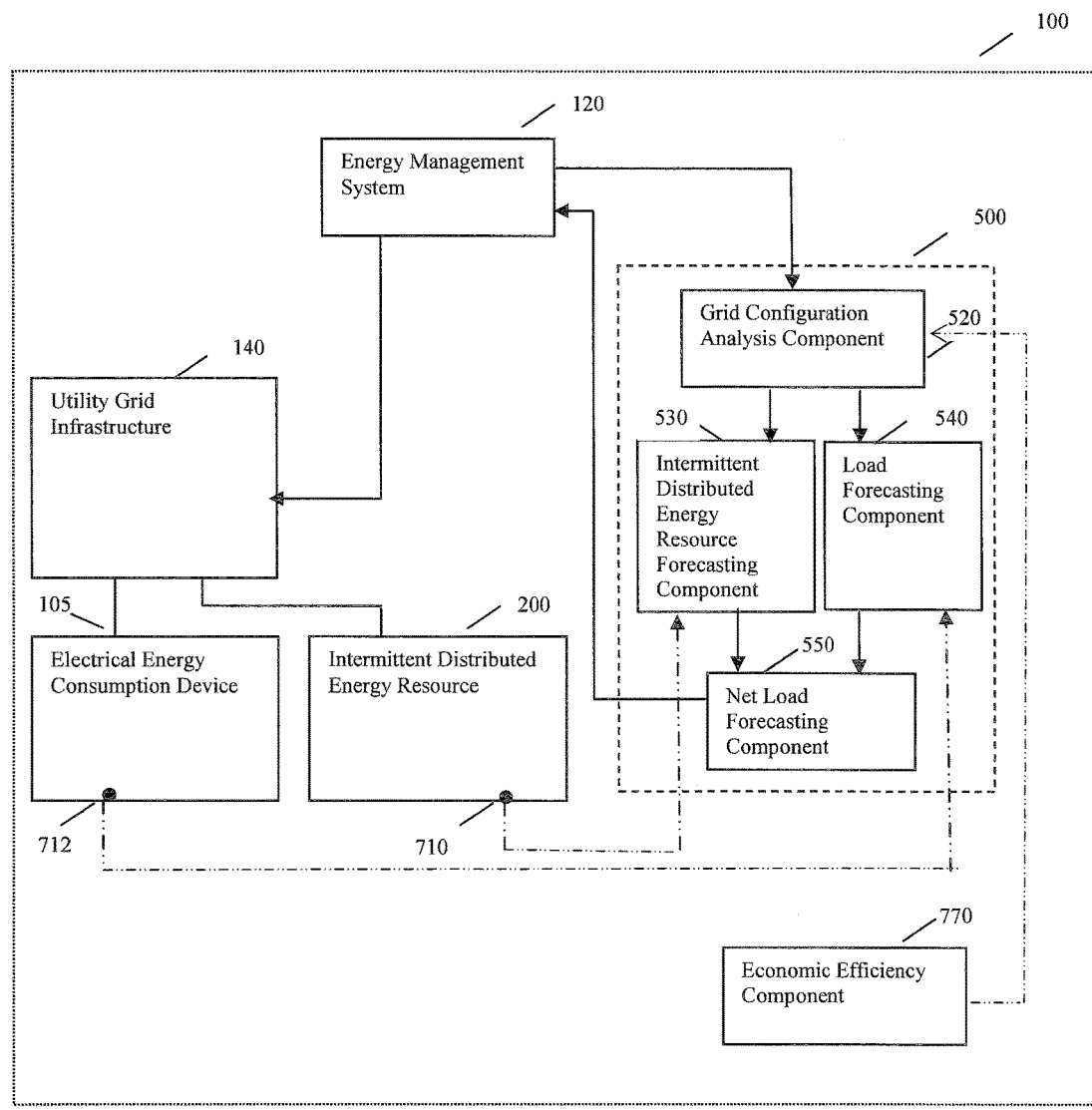
FIG. 5 is a block diagram illustrating a utility grid and a net load forecasting system in accordance with another embodiment of the application.

FIG. 5 is a block diagram illustrating a utility grid 100 and a net load forecasting system 500 in accordance with another embodiment of the application. The basic configuration of the utility grid 100 in FIG. 5 is similar to the grid 100 shown in FIG. 1. However, in FIG. 5, the grid configuration analysis component 520 is connected to at least one economic efficiency component 770. The economic efficiency component 770 provides at least one economic efficiency variable, which is typically selected from the group consisting of: a cost of operation, a fuel price, a market price of electrical energy, and a power transmission fee. The net load forecasting system 500 is configured to forecast net load at least partially based on the economic efficiency variable provided by the economic efficiency component 770. Thus, the grid configuration analysis component 520 may decide to aggregate the loads 105 into load forecast zones 900 also based on economic factors.

Figure 6:
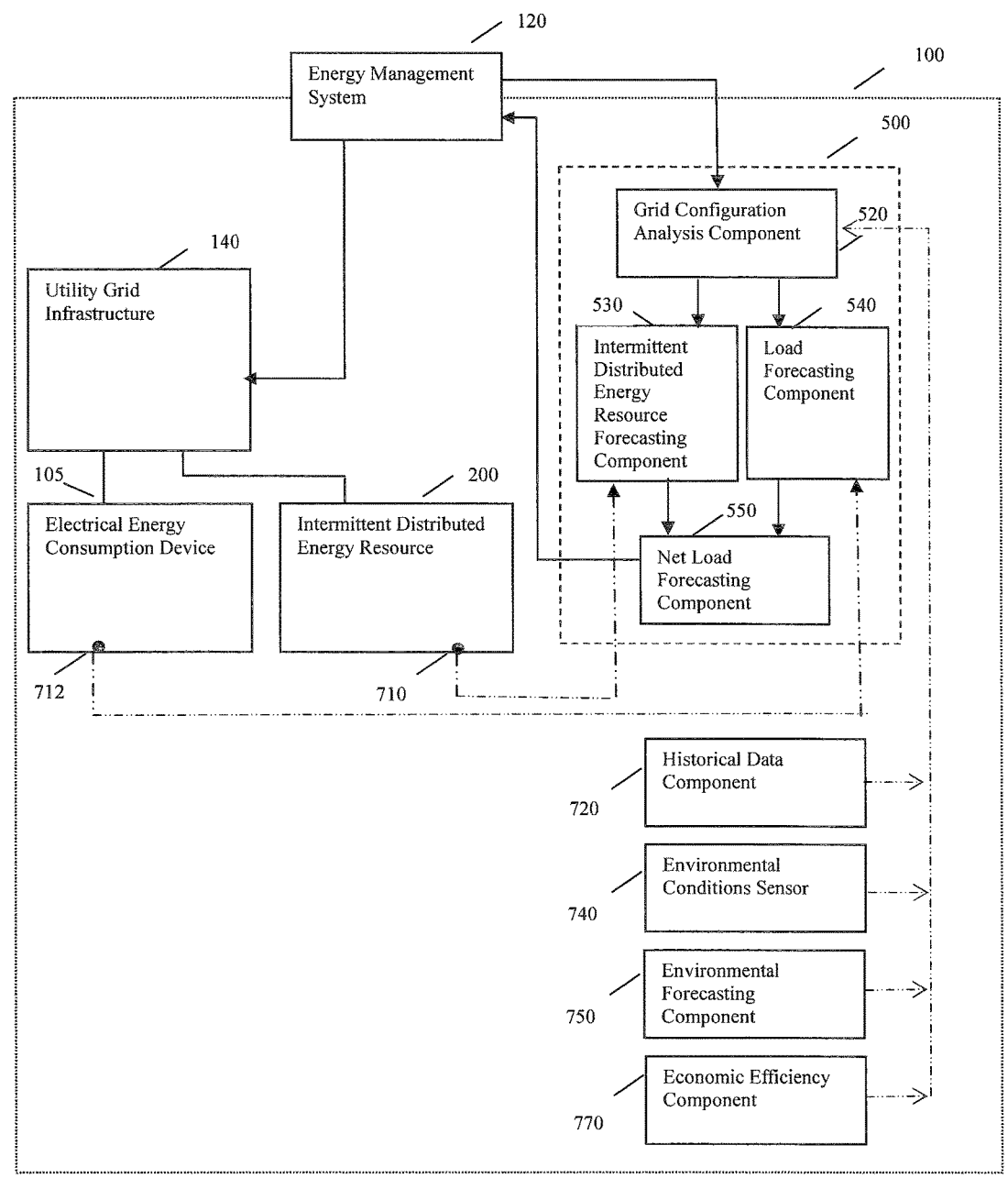
FIG. 6 is a block diagram illustrating a utility grid and a net load forecasting system in accordance with another embodiment of the application.

FIG. 6 is a block diagram illustrating a utility grid 100 and a net load forecasting system 500 in accordance with another embodiment of the application. The basic configuration of the utility grid 100 in FIG. 6 is similar to the grid 100 shown in FIG. 1. However, in FIG. 6, the grid configuration analysis component 520 is connected to a historical data component 720, an environmental condition sensor 740, an environmental forecasting component 750, and an economic efficiency component 770. Advantageously, the accuracy of net load forecasting by the net load forecasting system 500 and the efficiency of its subsequent use may be further improved by taking into account historical, actual and future conditions for intermittent distributed energy resources and loads as well as economic factors.

Figure 7:
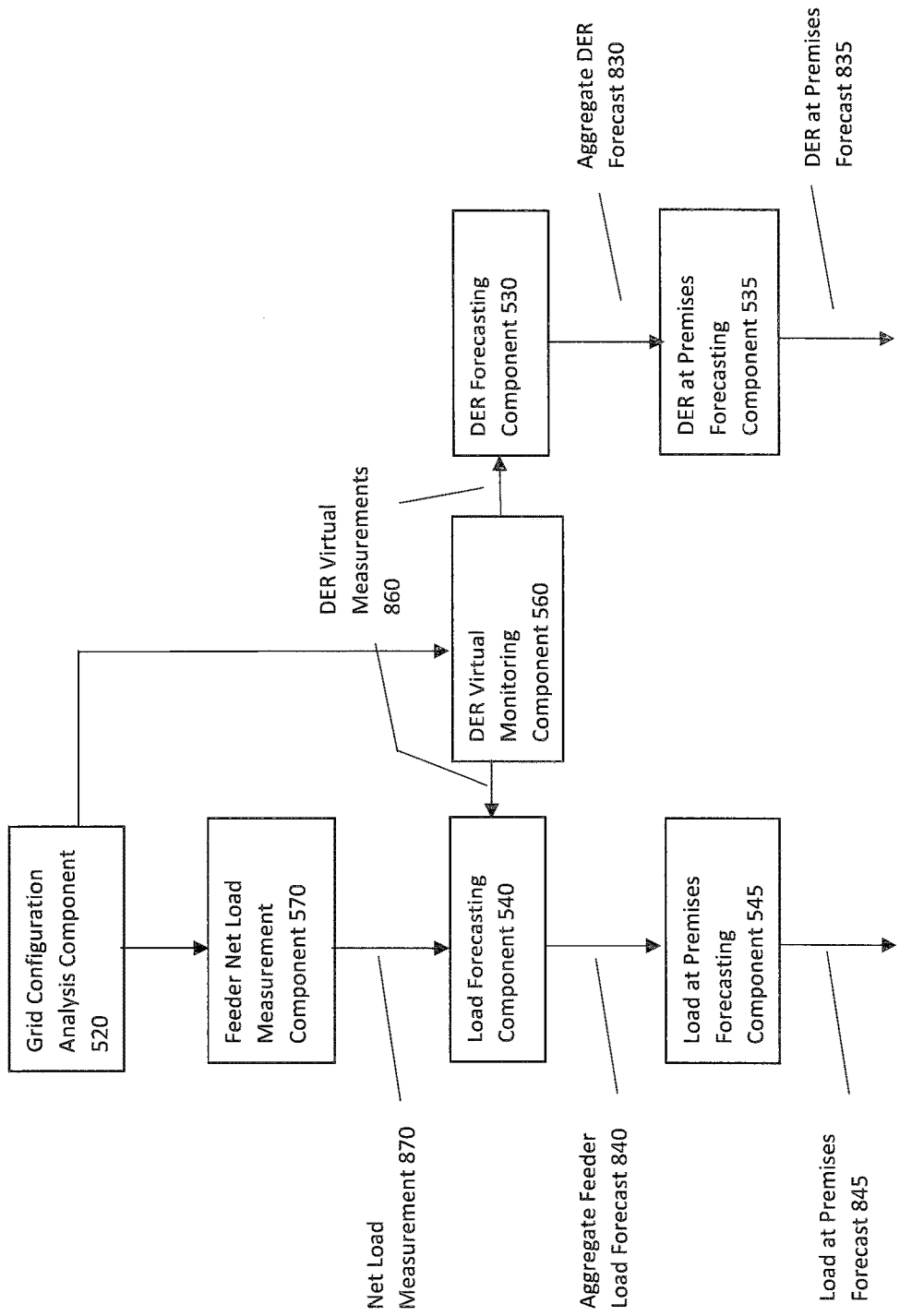
FIG. 7 is a block diagram illustrating a net load forecasting system for forecasting at the premises level in accordance with an embodiment of the application.

FIG. 7 is a block diagram illustrating a net load forecasting system 500 for forecasting at the premises level in accordance with another embodiment of the application. To maintain quality and reliability of the power supply, power distribution systems estimate power flows and voltages for various points in the distribution network or utility grid 100. The ability to calculate power flow and voltage distribution for feeders facilitates such important power system applications as Volt/VAR optimization, feeder load management, suggested switching, and other advanced applications. Volt/VAR optimization includes the generation of a set of optimal substation transformer tap positions and capacitor bank statuses to minimize system losses as system load changes. The operator is able to generate a switching management plan from each optimization plan. Feeder load management ("FLM") allows for management of energy delivery in the electric distribution system and identification of problem areas. FLM allows for the dynamic update of views showing closest-in-time alarms and peak loads for all feeders. It enables the identification of possibilities for problem avoidance which leads to both improved reliability and energy delivery performance. Suggested switching assists with the generation of switching steps to restore power to a de-energized device, or to de-energize and isolate a device that is currently energized, while minimizing the amount of resulting dropped load.

Estimating power flows and voltages at the feeder level requires a distribution management system ("DMS") to be able to forecast loads at the individual premises level. If a distributed energy resource ("DER") such as a PV generation plant is deployed at a premises, forecasting of both net load and load is important.

As conforming loads follow statistical patterns, load measurements are essential for load forecasting. Unfortunately, access to load measurement data is not always technically possible as smaller loads at the premises level may not have electric power meters that allow for data communications. In addition, it may not always be economical to equip all meters with communications capabilities, install communications infrastructure, and specifically acquire and process data from such meters. However, access to net load measurements at the feeder, group of feeders, and substation level is in most cases available through substation automation devices often realized within the substation supervisory control and data acquisition ("SCADA") system. This measurement data may be used for forecasting loads at the premises level.

To produce load forecasts at the premises level, the grid configuration analysis component 520 may branch or divide the utility grid 100 into load forecast zones 900 according to climate conditions and/or electrical energy consumption patterns and load measurement data availability. For example, such a load forecast zone 900 may be associated with one distribution feeder, with the feeder's aggregated net load being measured at a substation by a feeder net load measurement component 570 as illustrated in FIG. 7. The load forecasting component 540 then generates an aggregate feeder load forecast 840 based on net load measurements 870 received from the feeder net load measurement component 570 and on distributed energy resource ("DER") virtual measurements for the feeder 860 received from and produced by a distributed energy resource ("DER") virtual measurement component 560. Many distributed energy resources 200 like rooftop solar PV power plants are not equipped with devices for monitoring their power output. However, it is possible to assess the anticipated output from solar PV power plants in real-time knowing the installed capacity of the plants and their locations using a combination of satellite image processing and solar power plant modeling techniques. The measurement of PV plant power output in real-time using these combined modeling techniques (and not measurement by a device physically connected to the plant) may be referred to as "virtual measurement".

To produce load forecasts at the premises level 845, a load at premises forecasting component 545 assigns (e.g., divides) an aggregate load forecast value 840 proportionally to loads 105 based on individual premises load, nominal capacity, historical load profiles, or using other similar inputs.

To produce distributed energy resource forecasts at the premises level 835, a distributed energy resource at premises forecasting component 535 assigns (e.g., divides) an aggregate distributed energy resource forecast value 830 proportionally to distributed energy resources 200 based on individual premises nominal capacity of DERs, historical generation profiles of DERs, or analytical models of individual DERs.

Figure 8:
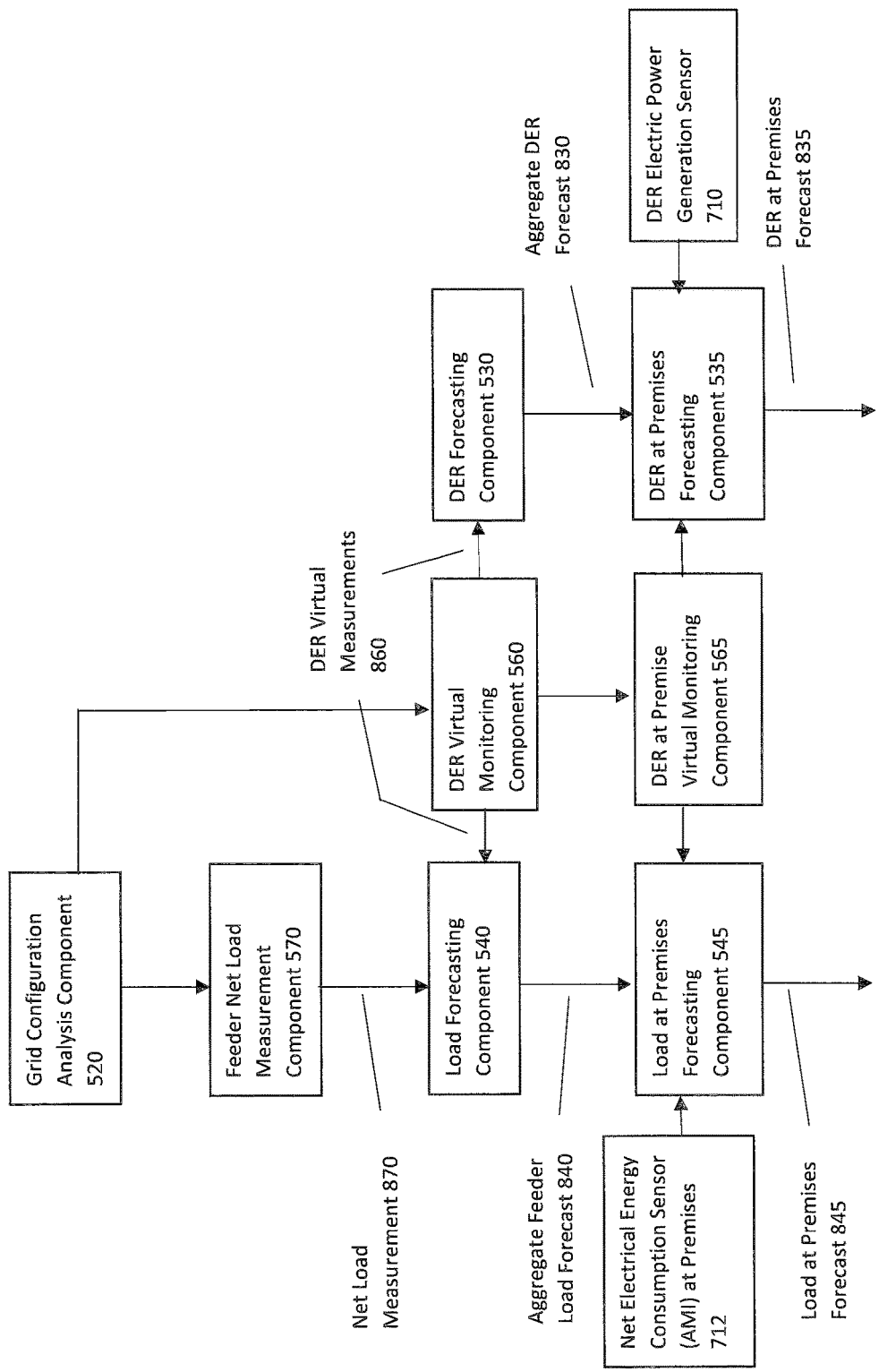
FIG. 8 is a block diagram illustrating a net load forecasting system for forecasting at the premises level in accordance with another embodiment of the application.
Figure 8A:
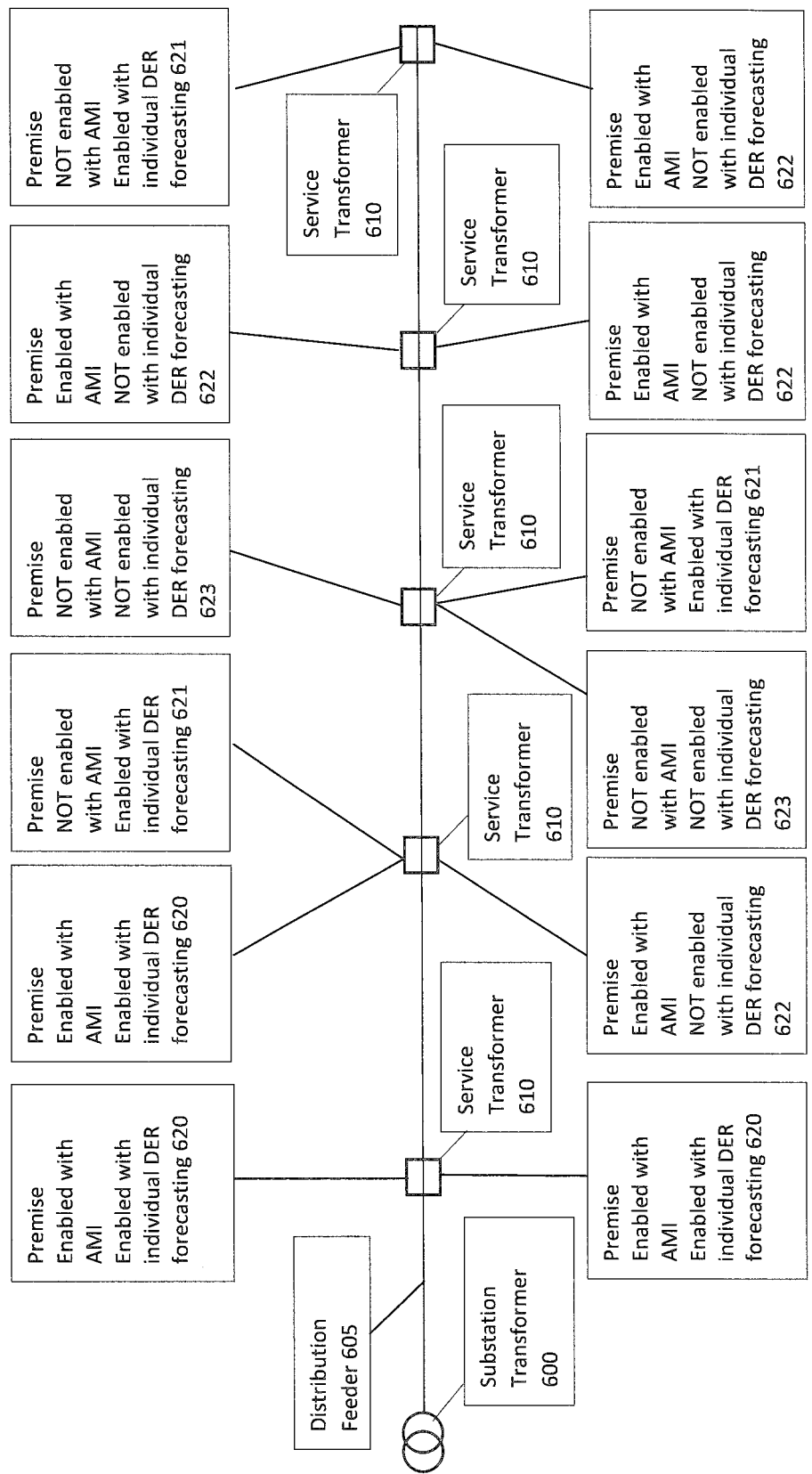
FIG. 8A is a block diagram illustrating a portion of a utility grid in accordance with an embodiment of the application.

FIG. 8 is a block diagram illustrating a net load forecasting system 500 for forecasting at the premises level in accordance with another embodiment of the application. And, FIG. 8A is a block diagram illustrating a portion 145 of a utility grid 100 in accordance with an embodiment of the application. The utility grid portion 145 includes a substation transformer 600 which provides power to a distribution feeder 605 which distributes the power to connected service transformers 610 supplying various premises 620, 621, 622, 623. In some cases, access to net load data for some of the premises 620, 621, 622, 623 supplied by a feeder 605 is available. For example, larger loads such as commercial buildings 620 may have advanced metering infrastructure ("AMI") 712 in place and a DER located behind the meter as shown in FIGS. 8 and 8A. In such cases, the load at premises forecasting component 545 will forecast the load for these premises based on these net load measurements and virtual measurements of the distributed energy resource output for these premises as produced by the distributed energy resource at premise virtual monitoring component 565. After that, a load at premises forecasting component 545 will assign or distribute the balance (i.e., the difference) between the aggregated feeder load forecast value and the total load forecast value for AMI-enabled premises (e.g., 620) to premises not enabled or equipped with AMI (e.g., 621).

In other cases, detailed specifications and/or historical generation profiles and/or real-time output measurements are available for some DER at individual premises. For example, larger commercial PV systems at commercial buildings with no AMI 623 as shown in FIG. 8. In these cases, a distributed energy resource forecast for the premises will be produced by the distributed energy resource at premises forecasting component 535 based on DER models, generation profiles, and/or output measurement data. After that, the distributed energy resource at premise forecasting component 530 will assign or distribute the balance (i.e., the difference) between the aggregated DER forecast value 830 for the feeder 605 and the total value of DER forecasts for premises with individual DER load forecasts (e.g., 620) between the premises with no individual DER forecasts (e.g., 623).

In still other cases, for premises with larger loads and DERs equipped with measurements/historical data profiles/models, both load and DER output will be individually forecast for these premises. As individual premises forecasting involves costs, it may not be economical to forecast individual loads or DER output, specifically smaller ones, in all cases. The decision as to which premises loads and DER output will be forecast individually for may be based on relevant technical (e.g., the load is too small to forecast) and economic (e.g., the cost of forecasting is greater than the benefit of forecasting) factors.

Thus, according to one embodiment, there is provided a utility grid 100, comprising: an energy management system 120; at least one electrical energy consumption device 105;

an intermittent distributed energy resource for generating electric power 200; and, a net load forecasting system 500; wherein the energy management system 120 is connected to the net load forecasting system 500 and is configured to request net load forecasts from the net load forecasting system 500 to maintain operating conditions in the utility grid 100 within a desired range. In the above utility grid 100, the intermittent distributed energy resource 200 may include a solar power plant and/or a wind power plant and/or any other intermittent power plant including but not limited to in-stream hydro, wave and tidal power plants. The net load forecasting system 500 may be configured for providing near real-time net load forecasts for the utility grid 100 and/or any portion thereof in order to maintain the operating conditions in the utility grid 100 within the desired range. The net load forecasting system 500 may be connected to at least one sensor 712 for measuring electrical energy consumption in the utility grid 100, wherein measurement may be performed for an electrical energy consumption device 105, and wherein the net load forecasting system 500 is configured to forecast net load in the utility grid 100 and/or any portion thereof at least partially based on the electrical energy consumption measured by the sensor 712. The net load forecasting system 500 may be connected to at least one sensor 710 for measuring electric power generation in the utility grid 100, wherein measurement may be performed for an intermittent distributed energy resource 200, and wherein the net load forecasting system 500 is configured to forecast net load in the utility grid 100 and/or any portion thereof at least partially based on the electric power generation measured by the sensor 710. The net load forecasting system 500 may be connected to at least one sensor 740 indicative of at least one environmental condition selected from the group consisting of: wind speed, air density, air turbidity, irradiance, atmospheric turbulence, rain conditions, snow conditions, air temperature, and humidity, wherein the net load forecasting system is configured to forecast net load in the utility grid 100 and/or any portion thereof at least partially based on the at least one environmental condition measured by the sensor 740. The net load forecasting system 500 may be connected to at least one forecasting component 750 for providing at least one forecasting variable selected from the group consisting of: weather forecasts, storm warnings, wind speed, air density, air turbidity, irradiance, atmospheric turbulence, rain conditions, snow conditions, air temperature, and humidity, wherein the net load forecasting system 500 is configured to forecast net load in the utility grid 100 and/or any portion thereof at least partially based on the at least one forecasting variable provided by the forecasting component 750. And, the net load forecasting system 500 may be connected to at least one economic efficiency component 770 for providing at least one economic efficiency variable selected from the group consisting of: a cost of operation, a fuel price, a market price of electrical energy, a power transmission fee, wherein the net load forecasting system 500 is configured to forecast net load in the utility grid 100 and/or any portion thereof at least partially based on the at least one economic efficiency variable provided by the economic efficiency component 770.

According to another embodiment, there is provided a net load forecasting system 500 for maintaining desired operating conditions in a utility grid 100 comprising: a grid configuration analysis component 520; at least one intermittent distributed energy resource forecasting component 530; at least one load forecasting component 540; and, a net load forecasting component 550; wherein the grid configuration analysis component 520 is configured to divide a utility grid territory into load forecast zones 900 for maximized accuracy of net load forecasts. In the above net load forecasting system 500, the intermittent distributed energy resource 200 may include one or more solar power plants and/or one or more wind power plants and/or one or more of any other kind of intermittent power plants including but not limited to in-stream hydro plants, wave power plants, and tidal power plants. The intermittent distributed energy resource forecasting component 530 may be configured to predict the electric power generation of an intermittent distributed energy resource 200 within a selected forecasting horizon, wherein the intermittent distributed energy resource forecasting component 530 operates at least partially based on at least one forecasting variable selected from the group consisting of: weather forecasts, storm warnings, wind speed, air density, air turbidity, irradiance, atmospheric turbulence, rain conditions, snow conditions, air temperature, and humidity. The load forecasting component 540 may be configured to predict an electrical energy consumption of an electrical energy consumption device 105 within a selected forecasting horizon, wherein the load forecasting component 540 operates at least partially based on at least one forecasting variable selected from the group consisting of: weather forecasts, storm warnings, wind speed, air density, air turbidity, irradiance, atmospheric turbulence, rain conditions, snow conditions, air temperature, and humidity. And, the net load forecasting component 550 may be configured to generate electric power generation predictions from the intermittent distributed energy resource forecasting component 530 and from electrical energy consumption predictions from the load forecasting component 540 and produce net load forecasts for the utility grid 100 and/or any portion thereof.

According to another embodiment, there is provided a method for net load forecasting in a utility grid 100, comprising the steps of: defining a number and configuration of load forecast zones 900 in the utility grid 100 for net load forecasting; forecasting electric power generation within a selected forecast horizon by intermittent distributed energy resources 200 within the load forecast zones 900 individually or in clusters utilizing analytical models based on physical principles, statistical methods, and methods of artificial intelligence, or combinations thereof; dividing loads in the load forecast zones 900 into conformance load groups using non-conforming criteria to increase the accuracy of forecasting; forecasting electrical energy consumption within a selected forecast horizon within the load forecast zones 900 and conformance load groups individually per customer meter, or in clusters per distribution transformer, feeder, substation, or their combinations using statistical methods, artificial intelligence methods, or similar methods, or combinations thereof; and, producing net load forecasts within a selected forecast horizon for the load forecast zones 900 by generating forecasts of electric power generation by the intermittent distributed energy resources 200 and electrical energy consumption by the loads in the load forecast zones 900. In the above method, in the load forecast zones definition step, at least one historical data set may be obtained with respect to historical climate conditions and electrical energy consumption patterns in the utility grid territory, and in the forecasting steps, the electric power generation from the intermittent distributed energy resources 200 and electrical energy consumption by loads are forecast at least partially based on the at least one data set of historical climate conditions and electricity consumption patterns in the utility grid 100. In the forecasting steps, at least one measured variable may be obtained from at least one sensor 740 monitoring environmental conditions selected from the group consisting of an anemometer, an air densimeter, a hygrometer, a thermometer, a rain sensor, a snow sensor, a turbulence sensor and the like, and the electric power generation from the intermittent distributed energy resources 200 and the electrical energy consumption by loads are forecast at least partially based on the at least one measured variable selected from the group consisting of: wind speed, air density, air turbidity, irradiance, atmospheric turbulence, rain conditions, snow conditions, air temperature, and humidity. In the electricity generation forecasting step, at least one electricity generation variable may be obtained from at least one sensor 710 monitoring electricity generation by at least one intermittent distributed energy resource 200, and the electric power generation from the intermittent distributed energy resources 200 may be forecast at least partially based on the at least one measured electricity generation variable. In the electrical energy consumption forecasting step, at least one electricity consumption variable may be obtained from at least one sensor 712 monitoring electrical energy consumption by at least one electrical energy consumption device 105, and the electrical energy consumption by the electrical energy consumption devices 200 is forecast at least partially based on the at least one measured electricity consumption variable. In the forecasting steps, at least one forecasting variable may be obtained, and the electric power generation from intermittent distributed energy resources 200 and electrical energy consumption by loads are forecast at least partially based on the at least one forecasting variable selected from the group consisting of: weather forecasts, storm warnings, wind speed, air density, air turbidity, irradiance, atmospheric turbulence, rain conditions, snow conditions, air temperature, humidity. And, in the load zones definition step, at least one economic efficiency variable may be obtained, and the electric power generation from intermittent distributed energy resources 200 and electrical energy consumption by loads may be forecast at least partially based on the at least one economic efficiency variable selected from the group consisting of a cost of operation, a fuel price, a market price of electrical energy, or a power transmission fee.

The above embodiments may contribute to an improved utility grid 100, net load forecasting system 500, and method for forecasting net load in a utility grid 100 having distributed energy resources 200 and may provide one or more advantages. For example, by dividing the net load in the load forecast zones 900 into loads and intermittent distributed energy resources, grouping the loads by their level of conformance, providing independent forecasts for the distributed energy resources and for the load groups, and combining these forecasts into a single net load forecast for the load forecast zones 900, the overall level of non-conformance of the load forecast zones 900 is reduced and higher accuracy of net load forecasting may be achieved.

Aspects of the above described methods and systems may be summarized with the aid of a flowchart.

Figure 10:
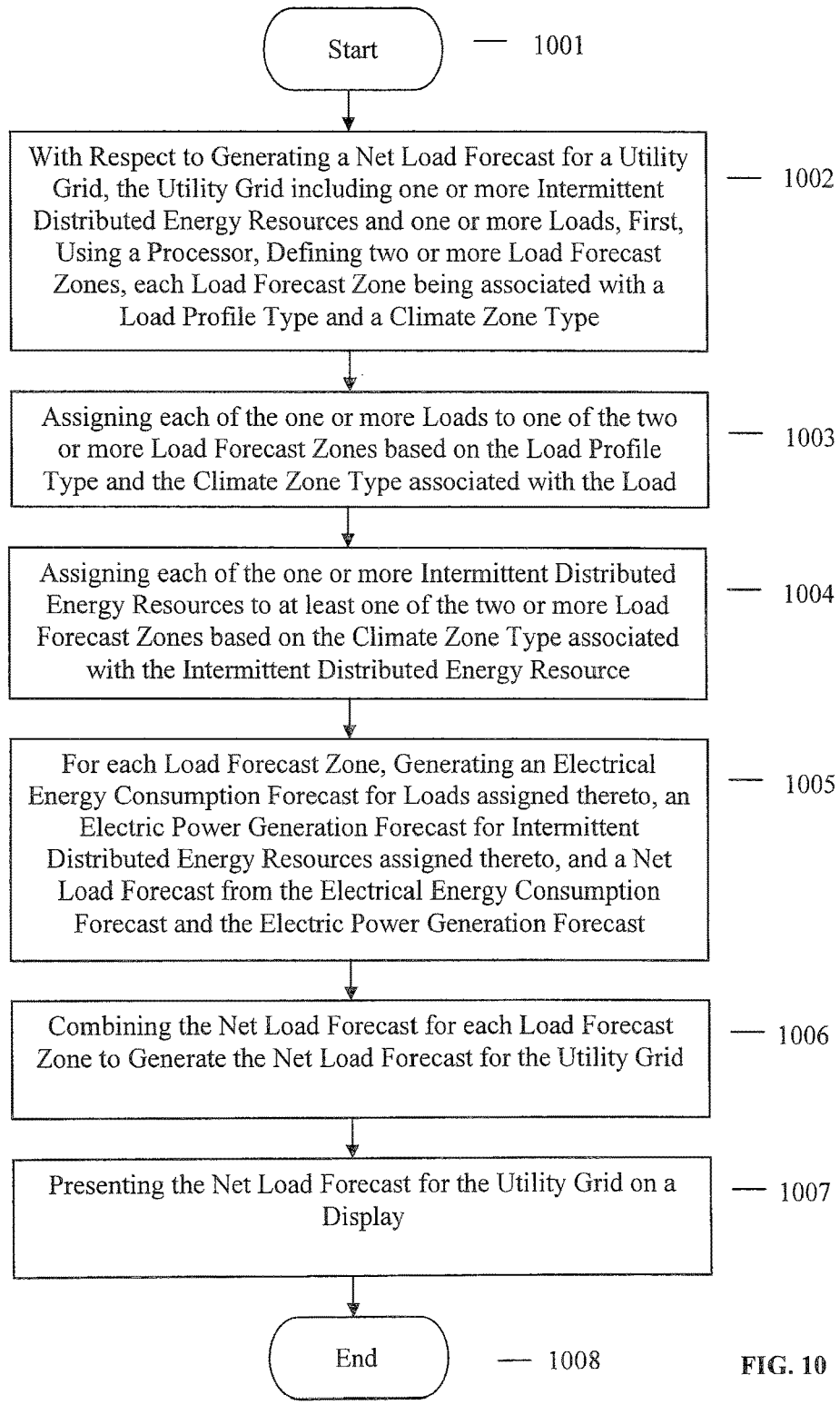

FIG. 10 is a flow chart illustrating operations 1000 of modules (e.g., 321, 331) within a data processing system (e.g., 120, 500, 300) for generating a net load forecast for a utility grid 100, the utility grid 100 including one or more intermittent distributed energy resources 200 and one or more loads 105, in accordance with an embodiment of the application.

At step 1001, the operations 1000 start.

At step 1002, using a processor 320, two or more load forecast zones 900 are defined, each load forecast zone 900 being associated with a load profile type 920 and a climate zone type 910.

At step 1003, each of the one or more loads 105 is assigned to one of the two or more load forecast zones 900 based on the load profile type 920 and the climate zone type 910 associated with the load 105.

At step 1004, each of the one or more intermittent distributed energy resources 200 is assigned to at least one of the two or more load forecast zones 900 based on the climate zone type 910 associated with the intermittent distributed energy resource 200.

At step 1005, for each load forecast zone 900, an electrical energy consumption forecast is generated for loads 105 assigned thereto, an electric power generation forecast is generated for intermittent distributed energy resources 200 assigned thereto, and a net load forecast is generated from the electrical energy consumption forecast and the electric power generation forecast.

At step 1006, the net load forecast for each load forecast zone 900 are combined to generate the net load forecast for the utility grid.

At step 1007, the net load forecast for the utility grid is presented on a display 340.

At step 1008, the operations 1000 end.

The above method may further include defining one or more climate zone types 910, each climate zone type 910 being associated with one or more climatic conditions. An output power of each intermittent distributed energy resource 200 may be dependent on the one or more climatic conditions associated with the load forecast zone 900 to which it is assigned. The one or more climatic conditions may include one or more local environmental conditions. The one or more local environmental conditions may include one or more of: wind speed, air density, air turbidity, irradiance, atmospheric turbulence, rain, snow, air temperature, and humidity. The method may further include defining one or more load profile types 920, each load profile type 920 being associated with a degree of conformance to an overall load profile of the utility grid. The load profile type 920 may be one of a conforming load profile and a non-conforming load profile. The conforming load profile may be a load profile that conforms to an overall load profile of the utility grid and the non-conforming load profile may be a load profile that does not conform to an overall load profile of the utility grid. The utility grid 100 may be a portion 145 of an electric utility grid 100. And, the one or more intermittent distributed energy resources 200 may include at least one of a solar power plant and a wind power plant.

According to one embodiment, each of the above steps 1001-1008 may be implemented by a respective software module 331. According to another embodiment, each of the above steps 1001-1008 may be implemented by a respective hardware module 321. According to another embodiment, each of the above steps 1001-1008 may be implemented by a combination of software 331 and hardware modules 321. For example, FIG. 10 may represent a block diagram illustrating the interconnection of specific hardware modules 1001-1008 (collectively 321) within the data processing system 300, each hardware module 1001-1008 adapted or configured to implement a respective step of the method of the application. As such, the present application advantageously improves the operation of the data processing system 300.

Referring to FIGS. 1-9, according to one embodiment, the grid configuration analysis component 520, the intermittent distributed energy resource forecasting component 530, the load forecasting component 540, the net load forecasting component 550, etc., may be implemented by a respective software module 331 within the net load forecasting system 500. According to another embodiment, the grid configuration analysis component 520, the intermittent distributed energy resource forecasting component 530, the load forecasting component 540, the net load forecasting component 550, etc., may be implemented by a respective hardware module 321 within or coupled to the net load forecasting system 500.

While aspects of this application are primarily discussed as a method, a person of ordinary skill in the art will understand that the apparatus discussed above with reference to a data processing system 300 may be programmed to enable the practice of the method of the application. Moreover, an article of manufacture for use with a data processing system 300, such as a pre-recorded storage device or other similar computer readable medium or computer program product including program instructions recorded thereon, may direct the data processing system 300 to facilitate the practice of the method of the application. It is understood that such apparatus, products, and articles of manufacture also come within the scope of the application.

In particular, the sequences of instructions which when executed cause the method described herein to be performed by the data processing system 300 may be contained in a data carrier product according to one embodiment of the application. This data carrier product may be loaded into and run by the data processing system 300. In addition, the sequences of instructions which when executed cause the method described herein to be performed by the data processing system 300 may be contained in a computer software product or computer program product (e.g., comprising a non-transitory medium) according to one embodiment of the application. This computer software product or computer program product may be loaded into and run by the data processing system 300. Moreover, the sequences of instructions which when executed cause the method described herein to be performed by the data processing system 300 may be contained in an integrated circuit product (e.g., a hardware module or modules 321) which may include a coprocessor or memory according to one embodiment of the application. This integrated circuit product may be installed in the data processing system 300.

The embodiments of the application described above are intended to be examples only. Those skilled in the art will understand that various modifications of detail may be made to these embodiments, all of which come within the scope of the application.

What is claimed is:

1. A method for generating a net load forecast for a utility grid by a net load forecasting system, the utility grid including one or more intermittent distributed energy resources and one or more loads, the method comprising:
   using a processor of the net load forecasting system, defining two or more load forecast zones, each load forecast zone being associated with a load profile type and a climate zone type;
   assigning each of the one or more loads to one of the two or more load forecast zones based on the load profile type and the climate zone type associated with the load;
   assigning each of the one or more intermittent distributed energy resources to at least one of the two or more load forecast zones based on the climate zone type associated with the intermittent distributed energy resource;
   for each load forecast zone, generating an electrical energy consumption forecast for loads assigned thereto using electrical energy consumption measurements for the one or more loads received by the net load forecasting system in real-time from at least one respective sensor, an electric power generation forecast for intermittent distributed energy resources assigned thereto using electric power generation measurements for the one or more intermittent distributed energy resources received by the net load forecasting system in real-time from at least one respective sensor, and a net load forecast from the electrical energy consumption forecast and the electric power generation forecast;
   combining the net load forecast for each load forecast zone to generate the net load forecast for the utility grid; and,
   presenting the net load forecast for the utility grid on a display.

2. The method of claim 1, further comprising defining one or more climate zone types, each climate zone type being associated with one or more climatic conditions.

3. The method of claim 2, wherein an output power of each intermittent distributed energy resource is dependent on the one or more climatic conditions associated with the load forecast zone to which it is assigned.

4. The method of claim 2, wherein the one or more climatic conditions include one or more local environmental conditions.

5. The method of claim 4, wherein the one or more local environmental conditions include one or more of: wind speed, air density, air turbidity, irradiance, atmospheric turbulence, rain, snow, air temperature, and humidity.

6. The method of claim 1, further comprising defining one or more load profile types, each load profile type being associated with a degree of conformance to an overall load profile of the utility grid.

7. The method of claim 1, wherein the load profile type is one of a conforming load profile and a non-conforming load profile.

8. The method of claim 7, wherein the conforming load profile is a load profile that conforms to an overall load profile of the utility grid and wherein the non-conforming load profile is a load profile that does not conform to an overall load profile of the utility grid.

9. The method of claim 1, wherein the utility grid is a portion of an electric utility grid.

10. The method of claim 1, wherein the one or more intermittent distributed energy resources include at least one of a solar power plant and a wind power plant.

11. The method of claim 1, wherein each load forecast zone is further associated with at least one of a time zone and an economic factor.

12. A net load forecasting system for generating a net load forecast for a utility grid, the utility grid including one or more intermittent distributed energy resources and one or more loads, the net load forecasting system comprising:
   a processor coupled to memory and a display; and,
   at least one of hardware and software modules within the memory and controlled or executed by the processor, the modules including:
   a module for defining two or more load forecast zones, each load forecast zone being associated with a load profile type and a climate zone type;
   a module for assigning each of the one or more loads to one of the two or more load forecast zones based on the load profile type and the climate zone type associated with the load;

a module for assigning each of the one or more intermittent distributed energy resources to at least one of the two or more load forecast zones based on the climate zone type associated with the intermittent distributed energy resource;

a module for, for each load forecast zone, generating an electrical energy consumption forecast for loads assigned thereto using electrical energy consumption measurements for the one or more loads received by the net load forecasting system in real-time from at least one respective sensor, an electric power generation forecast for intermittent distributed energy resources assigned thereto using electric power generation measurements for the one or more intermittent distributed energy resources received by the net load forecasting system in real-time from at least one respective sensor, and a net load forecast from the electrical energy consumption forecast and the electric power generation forecast;

a module for combining the net load forecast for each load forecast zone to generate the net load forecast for the utility grid; and, a module for presenting the net load forecast for the utility grid on a display.

13. The system of claim 12, further comprising a module for defining one or more climate zone types, each climate zone type being associated with one or more climatic conditions.

14. The system of claim 13, wherein an output power of each intermittent distributed energy resource is dependent on the one or more climatic conditions associated with the load forecast zone to which it is assigned.

15. The system of claim 13, wherein the one or more climatic conditions include one or more local environmental conditions.

16. The system of claim 15, wherein the one or more local environmental conditions include one or more of: wind speed, air density, air turbidity, irradiance, atmospheric turbulence, rain, snow, air temperature, and humidity.

17. The system of claim 12, further comprising a module for defining one or more load profile types, each load profile type being associated with a degree of conformance to an overall load profile of the utility grid.

18. The system of claim 12, wherein the load profile type is one of a conforming load profile and a non-conforming load profile.

19. The system of claim 18, wherein the conforming load profile is a load profile that conforms to an overall load profile of the utility grid and wherein the non-conforming load profile is a load profile that does not conform to an overall load profile of the utility grid.

20. The system of claim 12, wherein the utility grid is a portion of an electric utility grid.

21. The system of claim 12, wherein the one or more intermittent distributed energy resources include at least one of a solar power plant and a wind power plant.

22. The system of claim 12, wherein each load forecast zone is further associated with at least one of a time zone and an economic factor.

* * * * *